United States Patent [19]

Campisi et al.

[11] Patent Number: 4,618,131
[45] Date of Patent: Oct. 21, 1986

[54] PC BOARD HOLD DOWN SYSTEM

[75] Inventors: Carl Campisi, Chicago; Brian D. Kay, Arlington Heights, both of Ill.

[73] Assignee: Zenith Electronics Corporation, Glenview, Ill.

[21] Appl. No.: 738,137

[22] Filed: May 24, 1985

[51] Int. Cl.⁴ .............................................. B23Q 3/08
[52] U.S. Cl. ....................................... 269/32; 29/760; 269/58; 269/233; 269/903
[58] Field of Search ........................ 269/32, 27, 91, 93, 269/58, 60–61, 55, 233, 903; 29/760

[56] References Cited

U.S. PATENT DOCUMENTS

| | | | |
|---|---|---|---|
| 1,823,204 | 9/1931 | Long | 269/60 |
| 1,948,799 | 2/1934 | Oyster | 269/32 |
| 2,737,709 | 3/1956 | Lovelace | 269/61 X |
| 3,724,837 | 4/1973 | McPherson | 269/93 X |
| 4,331,326 | 5/1982 | Strauss | 269/93 |
| 4,508,327 | 4/1985 | Ersoy | 269/32 X |

FOREIGN PATENT DOCUMENTS

| | | | |
|---|---|---|---|
| 586963 | 11/1959 | Canada | 269/91 |
| 320364 | 3/1972 | U.S.S.R. | 269/32 |

Primary Examiner—Frederick R. Schmidt
Assistant Examiner—Steven P. Schad

[57] ABSTRACT

A hold down system for use with a generally planar printed circuit (PC) board includes at least one clamp which engages the circuit board and securely maintains it flat upon a circuit board transport mechanism to facilitate the insertion of electronic components upon the board by automatic positioning and insertion apparatus. The movable hold down clamp includes an elongated, generally vertically oriented housing which is positioned beneath the PC board and transport mechanism and is displaced upward above the PC board for engaging the board and pulling it downward upon the transport mechanism as the PC boards are displaced therealong. With an upper portion of the clamp extending above the circuit board either along an edge thereof or through an aperture therein, a pneumatically actuated hold down arm is extended laterally from the housing above the PC board and is displaced downward so as to engage the board's upper surface and pull the board downward and in tight-fitting engagement with the supporting transport mechanism. The PC board is thus securely maintained in a flat configuration and a fixed orientation and position during component insertion, testing, etc. Following component insertion on the PC board, the hold down arm is retracted, releasing the circuit board and the clamp is displaced downward allowing the transport mechanism to position another PC board above the hold down clamp whereupon the hold down procedure is repeated.

10 Claims, 5 Drawing Figures

PC BOARD HOLD DOWN SYSTEM

BACKGROUND OF THE INVENTION

This invention relates generally to printed circuit (PC) board assembly and is particularly directed to a PC board hold down system and clamp therefor for securely maintaining a circuit board in a flat configuration during the insertion of electronic components thereon.

The generally flat, board-like element upon which an electronic circuit is fabricated in many electronic apparatus is typically referred to as "substrate", or circuit board, and is used primarily for mechanical support and insulating purposes, such as with ceramic, plastic, and glass substrates, but semiconductor and ferrite substrates may also provide useful electrical functions. The conductive elements coupling circuit components are typically in the form of elongated metal foils which may be positioned on one or both sides of the circuit board. Circuit components are frequently positioned on a first side of the circuit board, with their associated electrical leads extending through predrilled apertures in the board so as to contact conductive foils on the reverse side of the board in completing the circuit.

Although initially assembled by hand, today these circuit boards are typically assembled by high speed, automatic positioning and insertion arrangements which sequentially move each circuit board in position in an assembly line fashion for positioning of the various electronic components thereon. Because of the small size of the components in general and the apertures in the circuit board in particular, precise alignment is required between the circuit board and the component insertion apparatus. Misalignment of the component leads with the circuit board apertures typically results in bent electrical leads or misalignment of the leads with respect to the conductors on the circuit board. Bent and misaligned electrical leads result in inadequate or incorrect electrical circuit connections requiring the entire circuit board assembly to be either discarded or repaired prior to installation in the end product.

Misalignment between component leads or terminals and the circuit board apertures is frequently due to the nonflat character of the circuit board. Irregularities in the flatness of the circuit board may arise from various factors such as irregularities in the manufacturing process, excessive heat or moisture in the circuit board storage environment, or mishandling of the circuit boards following their fabrication. Even relatively minor out-of-flatness distortions in the circuit board may result in misalignment between the mounting apertures in the board and the component leads to be inserted therein. Rather than being inserted through a mounting aperture so as to extend to the other side of the circuit board, a component lead may contact the upper surface of the circuit board due to its nonplanar configuration during the insertion procedure so as to prevent proper mounting and electrical connection of the component on the circuit board.

The present invention is intended to overcome the aforementioned limitations of the prior art by providing a hold down system and clamp therefor for securely maintaining a nonplanar circuit board in a flat configuration to insure precise alignment between the circuit board and automatic component handling apparatus during the insertion of components on the board. With an electronic component positioned immediately above the circuit board and in alignment with mounting apertures therein, the component may be lowered onto the circuit board with its lead extending through the mounting apertures to permit proper mounting of the component and its electrical connection to various conductors on either, or both, sides of the circuit board.

OBJECTS OF THE INVENTION

Accordingly, it is an object of the present invention to provide improved assembly a PC board by automatic electronic component insertion apparatus.

It is another object of the present invention to provide for more accurate and reliable positioning of electronic components upon a PC board.

Another object of the present invention is to provide an improved arrangement for securely maintaining a PC board in position upon a transport mechanism during the high speed, automatic insertion, verification and testing of electronic components upon on the board.

Still another object of the present invention is to provide a PC board hold down clamp for securely maintaining the board flat during the insertion of components thereon which is reliable, capable of rapid board engagement and disengagement, and does not interfere with the component insertion apparatus.

A further object of the present invention is to provide a high speed, remotely controlled, linearly displaceable clamp mechanism adapted for engaging a circuit board and for maintaining the circuit board in a flat configuration during the insertion, testing, connecting, etc., of electronic components thereon.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENT

Figure 1:
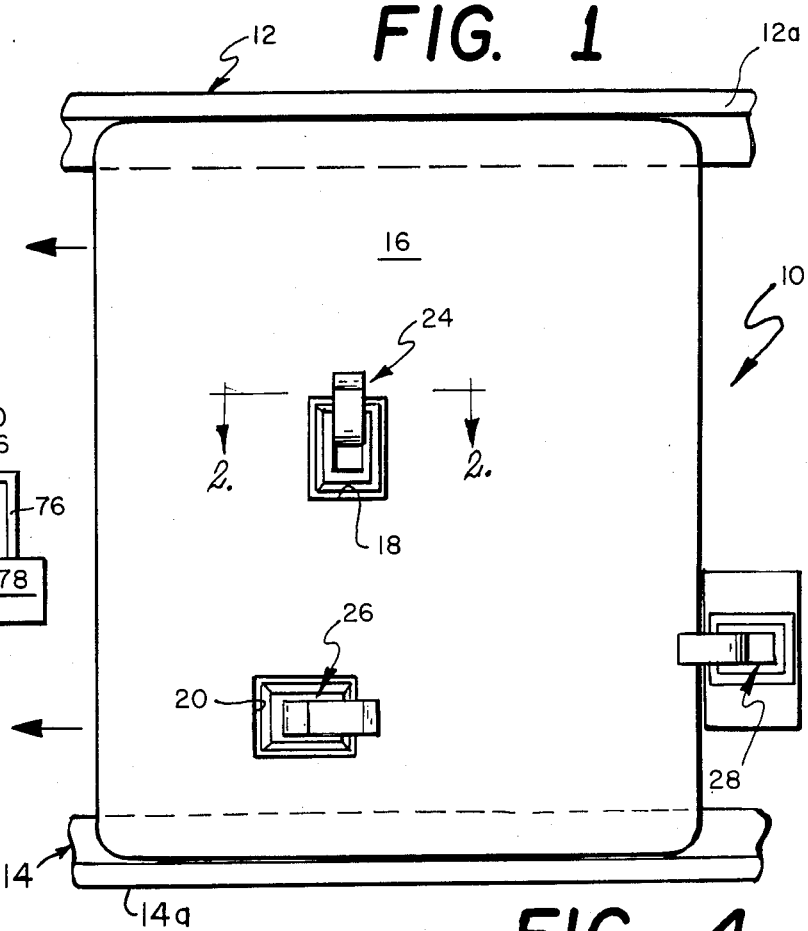
FIG. 1 is a plan view of a circuit board positioned on a transport mechanism and engaged by a hold down system including a plurality of hold down clamps during the assembly of the circuit board in accordance with the principles of the present invention.

Referring to FIG. 1, there is shown a printed circuit (PC) board hold down system 10 for engaging and maintaining a PC board 16 in a flat configuration as it is transported upon first and second support rails 12, 14. The first and second support rails 12, 14 may form a portion of a PC board transport system which transports a plurality of PC boards to various locations, or stations, where various circuit components are positioned upon the board in forming an electrical circuit in printed circuit form. The first and second support rails 12, 14 are typically utilized in systems for the automatic assembly of PC boards and each support rail generally includes a respective lateral wall 12a, 14a between which the PC boards are positioned for proper alignment with automatic component insertion apparatus (not shown). The first and second support rails 12, 14 may either be displaced in a linear manner or may merely provide support for the PC boards positioned thereon, with other means (not shown) provided for engaging and displacing the PC boards along the first and second support rails. Since the manner in which the PC board 16 is transported and positioned for engagement by the hold down system 10 does not form a part of the present invention, as the PC boards may be displaced by any number of conventional arrangements, the PC board transport and positioning system is not further described herein.

With the PC board 16 positioned upon and supported by the first and second support rails 12, 14 and aligned between the respective lateral walls 12a, 14a thereof, the PC board is adapted for engagement by one or more hold down clamp assemblies in accordance with the present invention. As shown in FIG. 1, the PC board 16 is securely engaged by first, second and third hold down clamp assemblies 24, 26 and 28. The first and second hold down clamp assemblies 24, 26 are respectively inserted through first and second apertures 18, 20 within the PC board 16l. The third hold down clamp assembly 28 is positioned immediately adjacent an edge of the PC board 16 so as to overlap and engage the upper surface of the PC board. With the PC board displaced in the direction of the arrows shown in FIG. 1, when the first and second apertures 18, 20 and the aft edge of the PC board are respectively positioned immediately above the first, second and third hold down clamp assemblies 24, 26 and 28, as determined by appropriate positioning and detection means (not shown), the three hold down clamp assemblies are displaced upward as described below so as to extend through either an aperture or above an edge of the circuit board. While FIG. 1 shows the PC board 16 engaged by three hold down clamp assemblies, the present invention is not limited to this number or the specific arrangement of clamp assemblies illustrated. Virtually any number of clamp assemblies may be used, including only a single clamp assembly. The only general requirement is that any clamp assembly engaging the PC board 16 be displaced from the structure supporting the board so that it is maintained in a flat configuration thereon.

Figure 2:
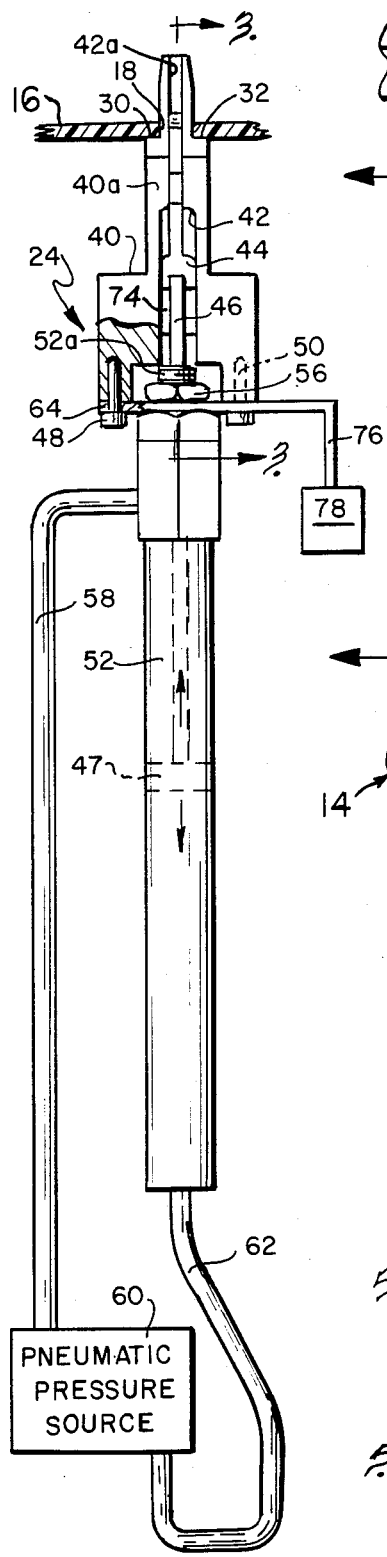
FIG. 2 is a sectional view of one of the hold down clamps shown engaging the circuit board in FIG. 1 taken along sight line 2—2 therein.

Referring to FIG. 2, which is a sectional view of the first hold down clamp assembly 24 shown in FIG. 1 taken along sight line 2—2 therein, there is shown a clamp assembly inserted through an aperture 18 in the circuit board 16. While the following description is directed to the first hold down clamp assembly 24 as shown in FIG. 2, this description applies equally well to the other two hold down clamp assemblies shown in FIG. 1. With an aperture in, or an edge of, the PC board 16 positioned above a respective hold down clamp assembly, the hold down clamp assembly is displaced upward by means of the combination of a displacement arm 76 and a displacement mechanism 78. As shown in FIG. 2, the displacement arm 76 is coupled to the combination of the hold down clamp assembly 24 and a pneumatic cylinder 52 and provides for the vertical displacement of this combination in response to actuation by the displacement mechanism 78. The combination of the displacement arm 76 and displacement mechanism 78 is shown in simplified schematic form in FIG. 2 because the manner in which the clamp assembly and pneumatic cylinder are displaced may be accomplished by any number of conventional arrangements, the details of which do not form a part of the present invention. As shown in FIG. 2, the hold down clamp assembly 24 is in the fully upraised position so as to be inserted within an aperture 18 in the circuit board 16 and to extend above the upper surface thereof.

Figure 3:
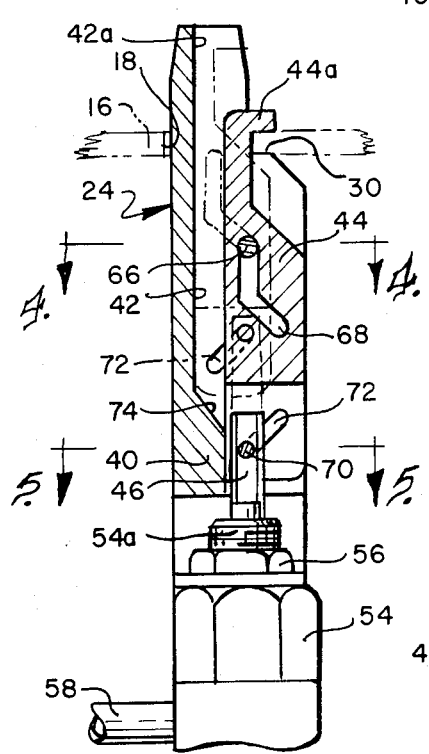
FIG. 3 is a sectional view of the hold down clamp assembly of FIG. 2 taken along sight line 3—3 therein showing the clamp in the printed circuit board engaging and nonengaging positions.

Referring to FIGS. 2 and 3, the latter of which is a sectional view of the hold down clamp 24 illustrated in FIG. 2 taken along sight line 3—3 therein, the hold down clamp assembly includes a generally vertically oriented housing 40 having an upper narrow portion 40a. The distal end of the upper portion 40a of the hold down clamp housing 40 is inserted through the PC board's aperture 18 such that a pair of shoulders 30, 32 on the housing engage a lower surface of the PC board 16. Extending along the length of the housing is a slot 42 which includes an upper, narrow portion 42a. Positioned within the slot 42 is a hold down clamp 44 which is generally Y-shaped, or yoke-shaped, and is freely displaceable within and along the slot 42. An upper portion of the hold down clamp 44 is narrower than the lower portion thereof and is positioned within the upper, narrow portion 42a of the slot 42. The upper distal end of the hold down clamp 44 is provided with a hook portion 44a which extends outward from the hold down clamp.

A double acting pneumatic cylinder 52 is securely coupled to a lower end portion of the hold down clamp housing 40 in the following manner. Mounted to the lower end portion of the hold down clamp housing 40 by means of coupling pins 48 and 50 is a cylinder bracket 64. The cylinder bracket 64 includes an aperture (not shown) therein through which an upper, threaded end portion 52a of the pneumatic cylinder 52 is inserted. A nut 56 is positioned upon the upper, threaded end portion 52a of the pneumatic cylinder 52 for securely coupling the hold down clamp assembly 24 to the pneumatic cylinder 52. Positioned within the pneumatic cylinder 52 and free displaceable along the length thereof is the combination of a cylinder 46 and a cylinder head 47. The elongated cylinder rod 46 extends through an aperture in the upper, threaded end portion 52a of the pneumatic cylinder 52 and is coupled to the hold down clamp 44 as described below.

Upper and lower pneumatic lines 58, 62 are coupled to respective ends of the pneumatic cylinder 52 and are also each coupled at the other ends thereof to a pneumatic pressure source 60. The pneumatic pressure source 60 controls the position of the cylinder head 47 within the pneumatic cylinder 52 and, in turn, the extension and retraction of the cylinder rod 46 relative to the pneumatic cylinder. By increasing the pressure in the upper pneumatic line 58, the pneumatic pressure source 60 displaces the cylinder head 47 downward in retracting the cylinder rod 46 within the pneumatic cylinder 52. Similarly, by increasing the pressure within the lower pneumatic lines 62, the pneumatic pressure source 60 displaces the cylinder head 47 upward so as to extend the cylinder rod 46 from the pneumatic cylinder 52. The double acting operation of the pneumatic cylinder 52 permits the extension and retraction of the cylinder rod 46 from the pneumatic cylinder to be precisely controlled. It is by the extension and retraction of the cylinder rod 46 that the hold down clamp 44 engages and releases the PC board 16 as described below.

As shown in FIG. 2, the displacement arm 76 is coupled to and continuous with the cylinder bracket 64 positioned between the hold down clamp housing 40 and the double acting pneumatic cylinder 52. Upward and downward displacement of the cylinder bracket and displacement arm in response to actuation by the displacement mechanism 78 results in the vertical displacement of the combination of the hold down clamp housing 40 and pneumatic cylinder 52 as described above. With the hold down clamp housing 40 displaced fully upward by means of the displacement mechanism 78, the upper end portion of the clamp housing is positioned within the aperture 18 of the PC board 16. The PC board 16 may then be engaged by the hold down clamp assembly 24 as described below in order to maintain the PC board in a flat configuration during the insertion of electronic components thereon. When the combination of the hold down clamp housing 40 and the pneumatic cylinder 52 is displaced downward by the displacement mechanism 78, the upper end of the clamp housing is removed from the PC board's aperture 16 allowing the PC board to be displaced from immediately above the hold down clamp assembly 24 and another PC board to be positioned directly above the hold down clamp assembly during the electronic component insertion process.

Referring to FIG. 3, the hold down clamp 44 is shown in the extended, PC board engaging position in solid line form within the clamp housing 40. Similarly, the hold down clamp 44 is shown in dotted line form in the retracted position within the clamp housing 40 wherein the PC board 16 is not engaged by the hold down clamp. The hold down clamp 44 is displaced between the aforementioned extended and retracted positions in the following manner.

The hold down clamp 44 includes an upper, angled slot 78 positioned therein. Fixedly mounted within the hold down clamp housing 40 and extending across the upper, narrow portion 42a of the slot 42 therein is a sliding pin 66. The sliding pin 66 is positioned within the upper slot 68 in the hold down clamp and extends through the narrow, upper portion of the hold down clamp 44. Each of the lower, lateral portions of the hold down clamp 44 is provided with a lower, elongated, linear slot 72. Positioned within the lower slots 72 in the hold down clamp 44 and inserted through an aperture in the upper end portion of the cylinder rod 46 is a coupling pin 70. The coupling pin 70 connects the cylinder rod 46 to the hold down clamp 44 which may then be displaced in response to the extension and retraction of the cylinder rod.

With the cylinder rod 46 in the retracted position, the hold down clamp 44 is displaced to the extended position within the hold down clamp housing 40 in the following manner. Retraction of the cylinder rod 46 within the pneumatic cylinder 52 causes the downward displacement of the coupling pin 70 within the lower slots 2 of the hold down clamp 44. Because of the angled orientation of the lower slots 72 relative to the axial displacement direction of the cylinder rod 46, retraction of the cylinder rod will cause the hold down clamp 44 to be displaced to the right as shown in FIG. 3. As the hold down clamp 44 is displaced downward, a lower surface of the hold down clamp will engage a wedge, or angled, portion 74 of the clamp housing 40 within the slot 42 therein which guides the hold down clamp in a rightward direction as it is moved downward by retraction of the cylinder rod 46. As shown in FIG. 3, with the cylinder rod 46 in the fully retracted position, the coupling pin 70 is positioned at the extreme lower ends of the lower slots 72.

With the hold down clamp 44 in the fully extended position within the clamp housing 40, the sliding pin 66 is positioned at the extreme upper end of the upper slot 68 as shown in solid line form in FIG. 3. Extension of the cylinder rod 46 and upward displacement of the hold down clamp 44 causes the upper slot 68 to be displaced along the sliding pin 66. The angled nature of the upper slot 68 causes the leftward displacement of the hold down clamp 44 as it is displaced upward by the action of the cylinder rod 46. With the cylinder rod 46 fully extended, the sliding pin 66 is positioned at the extreme lower end of the upper slot 68 and the hold down clamp 44 is positioned in the upper lefthand portion of the hold down clamp housing 40 as viewed in FIG. 3. With the hold down clamp 44 thus retracted, the hook portion 44a thereof is positioned within the upper narrow portion 42a of the slot 42 in the clamp housing 40. Similarly, with the hold down clamp 44 extended, the hook portion 44a thereof extends outward beyond the upper, narrow portion of the clamp housing 40 so as to engage the upper surface of a PC board 16 having an aperture 18 through which the hold down clamp assembly is inserted. As shown in FIGS. 2 and 3, with the hold down clamp 44 in the fully extended position, the PC board 16 is securely positioned between the hook portion 44a of the hold down clamp and the pair of shoulders 30, 32 positioned on respective lateral portions of the clamp housing 40. By engaging the upper surface of the PC board 16 by means of the hook portion 44a of the hold down clamp 44 and drawing the PC board downward, the PC board may be securely maintained between the hook portion of the hold down clamp and the clamp housing shoulders 30, 32 so as to maintain a flat configuration upon the PC board transport mechanism to facilitate insertion of electronic components (not shown) on the PC board.

Figure 4:
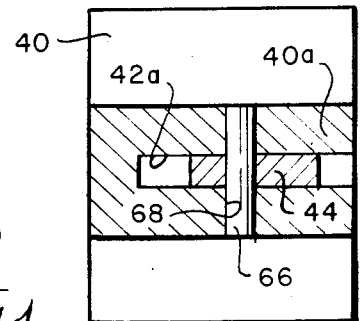
FIG. 4 is a sectional view of the hold down clamp assembly of FIG. 3 taken along sight line 4—4 therein with the clamp assembly in the printed circuit board engaging position.
Figure 5:
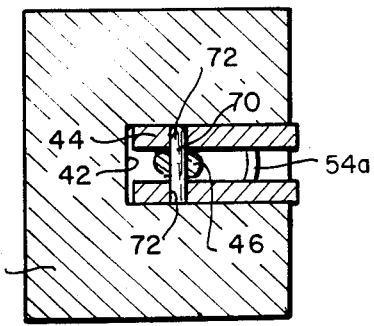
FIG. 5 is a sectional view of the hold down clamp assembly of FIG. 3 taken along sight line 5—5 therein with the clamp assembly in the printed circuit board engaging configuration.

Referring to FIGS. 4 and 5, there are respectively shown sectional views of the hold down clamp assembly 24 of FIG. 3 taken along sight lines 4—4 and 5—5 therein. FIG. 4 shows the details of the stationary positioning of the sliding pin 66 within the hold down clamp housing 40. Vertical displacement of the hold down clamp 44 and the positioning of the sliding pin 66 within the upper slot 68 of the hold down clamp results in the lateral displacement of the hold down clamp as it is retracted and extended within the clamp housing. Similarly, with respect to FIG. 5, it can be seen that vertical displacement of the cylinder rod 46 and coupling pin 70 positioned therein will cause the vertical and horizontal displacement of the hold down clamp 44 due to the angled orientation of the lower slot 72 relative to the direction of linear displacement of the cylinder rod.

There has thus been shown a PC board hold down system and clamp therefor for use with automatic circuit board assembly apparatus for maintaining a PC board in a flat configuration to facilitate the insertion of electronic components thereon. The PC board hold clamping system provides an efficient, reliable, convenient and inexpensive approach to compensating for nonplanar PC board configurations such as due to warpage which render machine insertion of components thereon impractical. The hold down clamps of the present invention are positioned on the opposite side of the PC board from that upon which the electronic components are placed to reduce the complexity of the PC board assembly operation. The PC board hold down clamp arrangement of the present invention not only eliminates errors in PC board assembly, but also maintains the PC board and components thereon in a flat configuration to facilitate the testing of components by appropriate circuit probes positioned on the side of the board opposite to that upon which the electronic components are inserted. The small size of the individual hold down clamps and the manner in which they are displaced avoids interference with, and thus minimizes the complexity of, the PC board transport system.

While particular embodiments of the present invention have been shown and described, it will be obvious to those skilled in the art that changes and modifications may be made without departing from the invention in its broader aspects. For example, while the preent invention has been disclosed in terms of its use with PC boards oriented generally horizontally, it is not limited to this orientation for PC board assembly but will operate equally well with PC boards in virtually any orientation and direction of displacement. In addition, the clamp arrangement of the present invention may be positioned above the PC boards as they are displaced. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. For use in the assembly of a PC board positioned upon and displaced by a transport mechanism as electronic components are positioned upon the PC board in predetermined locations on a first side thereof, clamp means for engaging and maintaining the PC board securely in position in a flat configuration upon the transport mechanism comprising:

a housing positioned on a second side of the PC board in a first retracted position, said housing including a linear slot aligned along the length thereof;

displacement means coupled to said housing for moving said housing between the first retracted position and a second extended position wherein said housing is positioned immediately adjacent to the PC board and extends to the first side thereof;

an arm positioned within the slot in said housing and movable along a first axis therein between a first retracted configuration and a second extended configuration in said housing, said arm including a distal hook portion recessed within said slot when said arm is in the first retracted configuration and extending outward from said slot when said arm is in the second extended configuration; and actuation means coupled to said arm for displacing said arm to said second extended configuration when said housing is in said second extended position whereupon the distal hook portion of said arm engages the PC board on the first side thereof and pulls the PC board tightly against the transport mechanism in securely maintaining the PC board in a flat configuration during the positioning of components thereon and for displacing said arm to said first retracted configuration following the positioning of components on the PC board, whereupon the distal hook portion of said arm disengages the PC board and said displacement means moves the housing to said first retracted position to permit the transport mechanism to displace the PC board from said clamp means.

2. The clamp means of claim 1 wherein the PC board transport mechanism includes first and second spaced parallel rails with said housing positioned intermediate said first and second rails.

3. The clamp means of claim 1 wherein the PC board includes an aperture therein with said housing inserted through said aperture when displaced to said second extended position by said displacement means.

4. The clamp means of claim 1 wherein said housing is positioned immediately adjacent to a lateral edge of the PC board when in said second extended position with said arm engaging the lateral edge of the PC board when moved to the second extended configuration.

5. The clamp means of claim 1 wherein said actuation means includes a double acting pneumatic cylinder having a cylinder rod coupled to said arm.

6. The clamp means of claim 1 wherein said housing further includes a lateral shoulder against which the PC board is tightly held by the distal hook portion of said arm when said arm is in the second extended configuration.

7. The clamp means of claim 1 wherein said actuation means includes engaging means for engaging said arm as it is moved along said first axis in said housing and for further displacing said arm along a second axis during its extension and retraction within the slot of said housing.

8. The clamp means of claim 7 wherein said first and second axes are oriented generally transverse to each other.

9. The clamp means of claim 8 wherein said housing includes a first fixed pin extending across the slot therein and wherein said arm is connected to said actuation means by means of a second coupling pin, said arm including upper and lower elongated apertures through which said first fixed and said second coupling pins respectively extend.

10. The clamp means of claim 9 wherein said upper and lower elongated apertures are oriented obliquely relative to the displacement of said actuation means for displacing said arm along said first and second axes.

* * * * *